INVENTOR
PAUL P. CASTRUCCI

BY Everett A. Gartrell

ATTORNEY

United States Patent Office 3,446,995

Patented May 27, 1969

3,446,995
SEMICONDUCTOR CIRCUITS, DEVICES AND METHODS OF IMPROVING ELECTRICAL CHARACTERISTICS OF LATTER

Paul P. Castrucci, Poughkeepsie, N.Y., assignor to International Business Machines Corporation, New York, N.Y., a corporation of New York Filed May 27, 1964, Ser. No. 370,468
Int. Cl. H03k 3/26, 19/08, 23/08
U.S. Cl. 307—304 3 Claims

ABSTRACT OF THE DISCLOSURE

A semiconductor device having a PN junction extending inwardly from a surface thereof. A layer of insulating material covers said surface, and this layer carries an area-type electrode which is disposed above said junction. Biasing means, including a load impedance, are connected across said junction via ohmic contacts to the P and N regions forming said junction; these biasing means provide a reverse-bias voltage across said junction greater than the pseudo breakdown voltage. Second biasing means pole the area-type electrode negatively, with respect to one of said regions, to control negative charge carrier accumulation at the surface. Control means reduce the negative biasing to render the device conductive.

The present invention is directed to semiconductor circuits and devices and methods of improving electrical characteristics of the latter. More particularly, the invention relates to semiconductor PN junction devices and methods for reducing the leakage current thereof and improving one or more electrical characteristics thereof such as the breakdown voltage characteristic, the current gain and device stability.

In the manufacture of semiconductor devices today, there is a definite trend toward devices which have one or more PN junctions which come to a surface thereof and have a passivating layer of insulating material covering the exposed junction or junctions and the surface regions adjacent thereto. Planar semiconductor devices of a material such as silicon which employ a silicon dioxide passivating layer are typical. While not limited to such devices, the invention will be described in that environment.

For many applications, it is desirable to employ a semiconductor device such as a diode or transistor which not only has a high breakdown voltage characteristic but also one which is stable over a range of operating temperatures. In the case of a transistor, it is difficult readily to achieve a high collector-base breakdown voltage characteristic. In actual practice, it heretofore has proved to be impossible to realize a breakdown characteristic which is substantially equal to that of the theoretical value of the avalanche breakdown of the device. Undesirable surface leakage across the pertinent junction of the device usually occasions a junction breakdown which is somewhat below the theoretical value, even when the device is subjected to the most careful and rigorous surface processing. Furthermore, in the case of a transistor, the current gain thereof is diminished by the various leakage currents. In a planar PNP transistor, the collector capacitance is often greater than is desired for many applications.

It is an object of the present invention, therefore, to provide a new and improved semiconductor device which avoids one or more of the above-mentioned disadvantages and limitations of prior such devices.

It is another object of the invention to provide a new and improved semiconductor device which exhibits a substantially higher voltage breakdown characteristic than has heretofore been obtainable.

It is a further object of the invention to provide a new and improved transistor which is characterized by its greatly improved collector-base breakdown voltage characteristic.

It is also an object of the present invention to provide a new and improved semiconductor device which is capable of achieving a voltage breakdown that is substantially equal to that of the theoretical value of avalanche breakdown.

It is a still further object of the invention to provide a new and improved method of fabricating passivated semiconductor devices which exhibit significantly improved electrical characteristics.

It is yet another object of the invention to provide a new and improved insulation-covered planar semiconductor device which overcomes a surface-state problem encountered in such devices.

It is an additional object of the present invention to provide a new and improved oxide passivated silicon planar semiconductor device which is capable of exhibiting a higher breakdown voltage characteristic and a greater temperature stability than has heretofore been conveniently obtainable.

It is another object of the invention to provide a new and improved semiconductor signal-translating circuit.

In accordance with the invention, a semiconductor device comprises a semiconductor member having first and second regions of opposite conductivity types defining a PN junction extending inwardly from a surface of that member, a layer of insulating material adherent to the aforesaid surface, and an area-type electro on the aforesaid layer and overlying at least part of a region of one of the aforesaid conductivity types adjacent the junction. The semiconductor device also includes means for biasing the aforesaid electrode to control the accumulation of negative charge carriers in a surface portion of the aforesaid region of that one conductivity type underlying the electrode for improving at least the reverse-voltage breakdown characteristic of the junction.

Further in accordance with the present invention, a signal-translating circuit comprises a semiconductor device having first and second regions of opposite conductivity types defining a PN junction extending inwardly from a surface of the device, ohmic connections to the first and second regions, a layer of insulating material adherent to the aforesaid surface, an area-type electrode on the aforesaid layer and overlying the junction and at least part of the first region adjacent the junction. The signal-translating circuit also includes biasing means including a load impedance connected between the ohmic connections for normally maintaining the device nonconductive, and biasing means for poling the aforesaid electrode negatively with respect to the ohmic connection to the first region to control the accumulation of negative charge carriers in a surface portion of the first region underlying the electrode for increasing the reverse-voltage breakdown characteristic of the junction. The signal-translating circuit also includes means coupled to one of the aforesaid biasing means for rendering the device conductive to establish a flow of of energy through the load impedance.

The foregoing and other objects, features and advantages of the invention will be apparent from the following more particular description of preferred embodiments of the invention, as illustrated in the accompanying drawings.

DESCRIPTION OF CIRCUIT AND DEVICE OF FIG. 1

Figure 1:
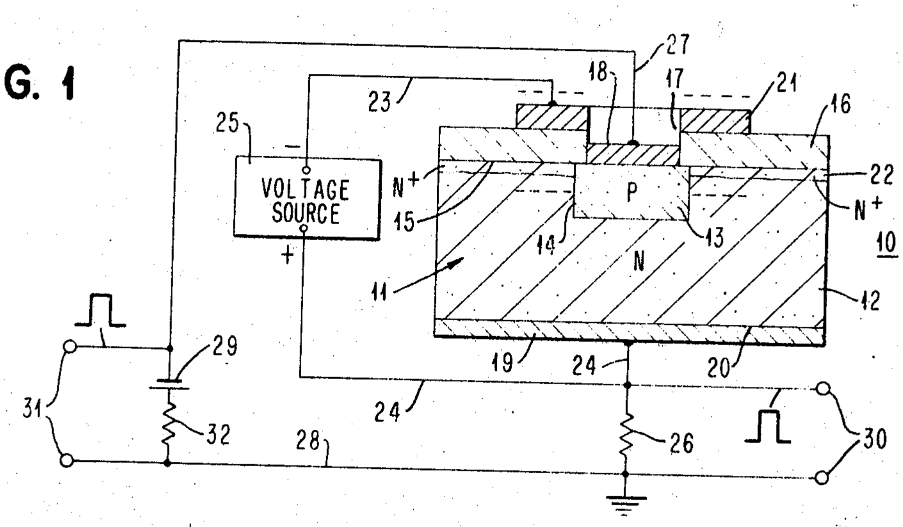
FIG. 1 is a schematic circuit diagram of a signal-translating circuit which includes a semiconductor device, represented in cross section, in accordance with a particular form of the present invention.

Referring now more particularly to FIG. 1 of the drawings, the signal translating circuit there represented includes a semiconductor device 10 comprising a semiconductor diode. Although the device may be made of suitable semiconductor material such as silicon, germanium or an intermetallic semiconductor compound, for the purpose of this description it will be considered to be a silicon diode, preferably of the planar type. To that end, the diode includes a semiconductor member 11 or starting wafer having first and second regions 12 and 13 of opposite conductivity types defining a PN junction 14 extending inwardly from a surface 15 of the member. Regions 12 and 13 will be considered as N-type and P-type, respectively. Although not shown in the drawing, region 12 may, if desired, be an epitaxial layer or a more highly doped or N+ substrate.

The member 11 also includes an inert impervious insulating layer 16, preferably in the form of an oxide coating having a thickness of the order of 5000–7000 angstroms overlying and in intimate contact with the surface 15. While various outside films may be employed, layer 16 preferably is one of silicon dioxide formed on surface 15 as by heating the member between 900–1400° C. in an oxidizing atmosphere saturated with water vapor or steam. Alternatively, layer 16 may be formed by heating the member 11 in the vapors of an organic silox ane compound such as tetraethyoxysilane at a temperature below the melting point of the member but above that at which the siloxane decomposes so that an inert film of silicon dioxide coats the desired surface. In the case of the planar device under consideration, the region 13 is formed by diffusing an impurity in a conventional manner through an aperture 17 etched through the silicon dioxide layer by well known photoengraving techniques. This creates in region 13 an impurity distribution which diminishes gradually from the surface 15. In the foregoing operation, the layer 16 constitutes a surface passivating and diffusion mask. It will be observed that in the diffusion operation, the impurity forming the region 13 creeps or diffuses for a short distance under the etched portion of the silicon dioxide layer 16 which defines the aperture 17.

Ohmic connections in the form of first and second electrodes 18 and 19 are suitably applied to exposed portions of regions 13 and 12, respectively, as by evaporation or plating. The electrode 19 is preferably attached to a surface 20 which is disposed opposite to the surface 15. The semiconductor diode thus far described is typical of a prior-art device. An area-type electrode 21 is applied as by evaporation to the silicon dioxide layer 16 over the inwardly extending junction 14 and over at least part of a selected one of the semiconductor regions, to wit, region 13, adjacent the inwardly extending junction. For the purpose of the present description, it will be assumed that electrode 21 is an annular one surrounding but insulated from electrode 18 by the silicon dioxide layer 16. It will be understood, however, that the electrode 21 could have another suitable geometry depending upon the geometry of the device.

In passivating the surface 15 of the semiconductor device with the silicon dioxide layer 16 and in protecting the junction 14 from contaminants where it comes up to the surface 15, whether the junction is produced by diffusion, alloying or other techniques, it has been found that undesirable surface states are produced which appear to be of the donor type. The manner in which they are created during the formation of the passivating layer 16 is quite complex and is not completely understood. A good explanation of why the surface states should be of the donor type is not known. However, it is believed that an accumulation of negative charge carriers is created in the region of the interface of the silicon dioxide film 16 and the surface of the silicon member 11, those negative charge carriers appearing in the surface portion of the silicon member 11 near its surface 15. In the surface portion of the N-type region 12 near the surface 15, the carriers are considered to manifest themselves in a manner which may be represented as a more strongly N-type doped skin or channel 22 which is designated as being N+ or degenerative.

Applicant has determined that these donor states represented in the drawings by the channel 22, in the absence of a proper bias on an area-type electrode 21, undesirably reduce the reverse-voltage breakdown of the semiconductor device to a value which is less than the true avalanche breakdown voltage of the bulk of the semiconductor material. For example, for one form of a silicon diode of the type under consideration, a reverse-voltage breakdown which may be termed a pseudo avalanche breakdown of 80 volts has been obtained in the absence of the biased electrode 21, whereas a voltage breakdown of about 290 corresponding substantially to the true avalanche breakdown was obtained with a suitably biased electrode 21. Manifestly, for many applications such as in a circuit subject to random voltage spikes, a high reverse-voltage breakdown in the device is very desirable or imperative. Heretofore, there has been no practical economical way of obtaining this desirable result. It has also been found that donor surface states increase as one employs higher-resistivity semiconductor materials in the environment under consideration. In the semiconductor diode presently being described (ignoring for the moment the presence of electrode 21), it would appear that a large leakage current which flows at the N+-P surface region of the device may be a factor in lowering the reverse-voltage breakdown of the junction 14 below its true avalanche breakdown value.

To improve or overcome the shortcomings of the semiconductor device thus far described, there are employed the area-type electrode 21 together with means for biasing that electrode to control the accumulation of negative charge carriers in a surface portion 22 of region 12 of the N-conductivity type underlying that electrode for improving at least the reverse-voltage breakdown characteristics of the PN junction 14. This means includes the usual leads 23 and 24 connected to the area-type electrode 21 and the electrode 19, respectively, for applying a bias developed by a voltage source 25 thereto. The latter may be of adjustable magnitude and is poled so that the leads 23 and 24 bias electrode 21 negatively with respect to the electrode 19. For some applications, such as when the device 10 is to be operated in a manner similar to the conventional diode, the source 25 may be a battery capable of applying a voltage of selected magnitudes. For another application, to be described subsequently, source 25 may be the series combination of a biasing battery, poled as indicated, and a voltage pulse generator for supplying positive-polarity pulses which are effective to overcome the bias supplied by the battery associated therewith.

The circuit under consideration further includes biasing means comprising a load impedance 26 connected between the ohmic connections or electrodes 18 and 19 for normally maintaining the device nonconductive. This means additionally comprises leads 27 and 28 and the series combination of a resistor 32 and a voltage source such as a battery 29 which is poled reversely to bias the PN junction 14. Lead 28 may be grounded as represented. A pair of terminals 30, 30 are connected across the load impedance 26 for deriving an output signal therefrom. The diode circuit additionally includes means coupled to one of the biasing means, namely across the battery 29, for rendering the semiconductor device 10 conductive to establish a flow of energy through the load impedance 26. This last-mentioned means includes a pair of terminals 31, 31 which in turn may be connected to a suitable voltage pulse generator for delivering positive-polarity pulses which are capable of momentarily overcoming the hold-off bias on the junction 14 supplied by the battery 29.

EXPLANATION OF OPERATION OF FIG. 1 CIRCUIT

Before making an explanation of the operation of the circuit of FIG. 1, an endeavor will be made to explain what is considered to be taking place to improve at least one of the reverse-voltage breakdowns of the device, the leakage current and the temperature stability thereof. Applicant's work with devices of the type under consideration has demonstrated that the reverse-voltage breakdown of the diode is not determined by the doping of the semiconductor material but rather is controlled by the magnitude of the surface charge. True avalanche breakdown occurs when the density of the negative surface charge is reduced to that of the bulk doping density. Through the use of the biased auxiliary or area-type electrode 21, the accumulated negative charge carriers present in the $N^+$ skin or channel 22 can be removed during operation of the application of a negative polarity field across the interface of the silicon dioxide layer 16 and the N-type region 12. The magnitude of the negative voltage applied to the electrode 21 to achieve a breakdown voltage, which negative voltage ordinarily is somewhat less than that of the avalanche breakdown figure, will vary depending on device parameters such as thickness of the oxide film, impurity concentration of the semiconductor regions, the semiconductor material employed, and device geometry. A thicker oxide layer 16 ordinarily requires the application of a higher reverse voltage on the electrode 21.

With a reverse voltage of proper magnitude on the electrode 21, the negative charge established thereon by the source 25 is effective to repel the negatively charged carriers in the $N^+$ skin 22 underlying the electrode 21 and to displace them farther into the surface portion or into the bulk of the N-type semiconductor region 12. This action has been represented diagrammatically by the series of negative (−) signs shown just beneath the $N^+$ skin 22. This displacement into the bulk of the semiconductor material controls or reduces the accumulation of negatively charged carriers in the $N^+$ skin adjacent the inwardly extending PN junction 14 and greatly improves the reverse-voltage breakdown of that junction. In fact, this displacement may be looked upon as an elimination of the $N^+$ skin 22. This action also reduces leakage currents which otherwise would flow from the surface of the N-type region 12 to the exposed surface of the $N^+$ skin 22 which lacks a covering by the silicon dioxide layer 16, and then through that layer and across the junction therewith and the P-type region 13. Another important benefit is also realized. It has been found that the temperature stability of the device with respect to its reverse-voltage breakdown at high operating temperatures of the order of 150–200° C. is improved. In that connection, by adjustment of the voltage applied by source 25, the breakdown voltage can be fixed to correspond substantially to the avalanche breakdown voltage whereas without the biasing field electrode 21 the breakdown voltage not only is materially lower but varies inversely with respect to the magnitude of the operating temperature. During operation, the improved diode of FIG. 1 is therefore a more reliable device from several standpoints.

As an example of what may be accomplished from the standpoint of improving the reverse-voltage breakdown characteristic for a semiconductor diode as represented in FIG. 1 which includes a region 12 of 5 ohm centimeter N-type silicon, a diffused P-type region 13 having a boron impurity concentration of $2\times10^{18}$ atoms per cubic centimeter at the surface, an oxide layer 16 formed by the thermal oxidation operation and having a thickness of 5000–6000 angstroms and extending 1–2 mils beyond the PN junction 14 into the P-type region 13 as represented in the drawing, a breakdown voltage of 300 volts was realized using a field electrode 21 which extended over that junction and which had a bias of 200 volts applied thereto that was negative with respect to the oppositely disposed electrode 19. In the absence of the biased electrode 21, the breakdown voltage proved to be but 80 volts.

With a negative voltage of 200 volts supplied by the source 25 on the electrode 21, the diode of FIG. 1 may be operated in a manner similar to that of a conventional semiconductor diode. Battery 29 reversely biases the junction 14 so that the device is normally nonconductive. The application to the terminals 31, 31 of a pulse of positive polarity of sufficient amplitude to overcome that bias renders the diode conductive and causes a flow of current through the load impedance 26. This in turn develops an output pulse of positive polarity across the terminals 30, 30.

Figure 2:
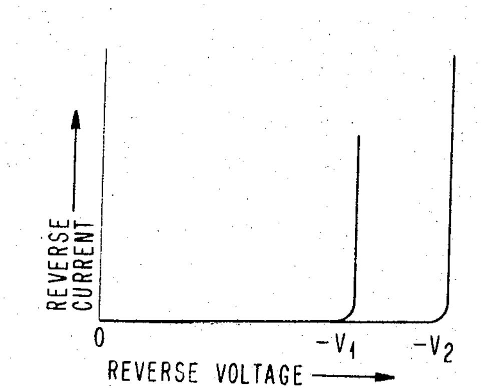
FIG. 2 is a set of curves used in explaining one mode of operation of the device of FIG. 1.

The three-terminal device of FIG. 1 is also capable of being operated in another manner wherein it affords a very high power gain and functions as a high input impedance device like an electron tube amplifier. Referring now to FIG. 2 of the drawings, it will be assumed that the pseudo breakdown voltage of the reversely biased junction 14 is $-V_1$. Hence in the absence of the reversely biased field electrode 21, if the bias across the junction was equal to $V_1$, junction would break down. It will now be assumed that (1) the junction 14 is biased beyond $-V_1$ to the greater voltage $-V_2$, and (2) that the electrode 21 is biased sufficiently to prevent breakdown from occurring at $-V_2$ and to prevent a flow of current. If now the negative bias on the electrode 21 is suddenly removed or overcome by a positive pulse on the source 25, there results a large surge of current through the device and the load resistor 26 which manifests itself as a current step or pulse of negative polarity at the output terminals 30, 30. As with an electron tube, a control voltage is therefor effective to initiate a flow of output current.

DESCRIPTION AND EXPLANATION OF OPERATION OF SEMICONDUCTOR DIODE OF FIG. 3

Figure 3:
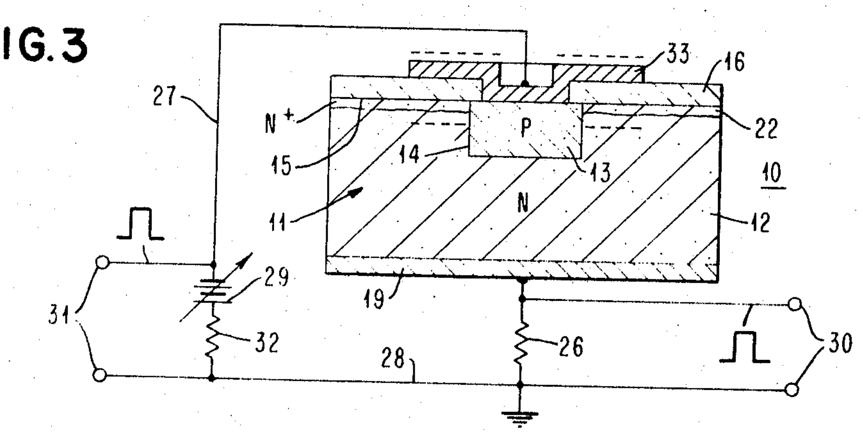
FIG. 3 is a circuit diagram similar to that of FIG. 1 which includes a semiconductor device in accordance with a modified form of the invention.

Referring now to FIG. 3, there is represented a semiconductor diode which is very similar to that of FIG. 1. Accordingly, corresponding elements are designated by the same reference numerals. The device of FIG. 3 differs from that of FIG. 1 in that a single electrode 33 is employed not only to provide an ohmic connection to the P-type region 13 but also as a field electrode to control the accumulation of negatively charged carriers in the $N^+$ surface portion 22. The central portion of the electrode 33 makes a low impedance connection to the region 13 while its flanged or extended outer portion extends over the vertical portion of the junction 14 and part of the silicon dioxide layer 16 and the skin 22. An auxiliary biasing source corresponding to the source 25 of FIG. 1 and its connections 23 and 24 are unnecessary since the adjustable source or battery 29 for reversely biasing the PN junction 14 serve that purpose.

The reverse biasing of the PN junction 14 by the source 29 acting on the extended electrode 33 causes a depletion of the negatively charged carriers at the interface of the silicon dioxide layer 16 and the surface 15 of the N-type region 12. By the action explained above in connection with FIG. 1, this reduces the accumulation of negatively charged carriers in a surface portion or skin 22 of the N-type region 12 underlying the electrode 33 and in turn improves the reverse-voltage breakdown and other characteristics of the semiconductor diode of FIG. 3.

DESCRIPTION OF TRANSISTOR OF FIG. 4

Figure 4:
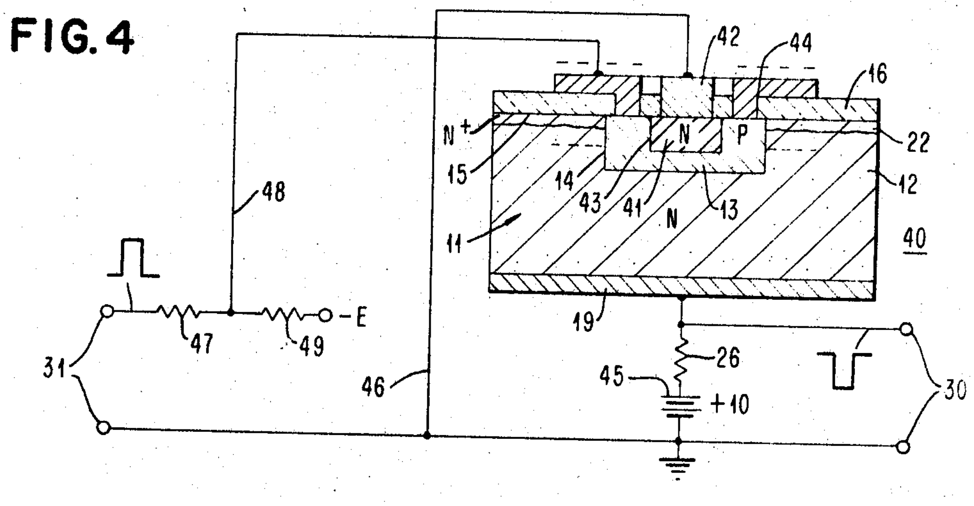
FIG. 4 is another circuit diagram of a signal-translating circuit employing a transistor in accordance with the present invention.

Referring now to FIG. 4 of the drawings, there is represented a transistor 40 which has portions that are generally similar to the devices of FIGS. 1 and 3. For ease of understanding, corresponding elements are designated by the same reference numerals. Regions 12 and 13 constitute the collector and base regions, respectively, of the transistor. Diffused into region 13 in the manner well known in the planar transistor art is the emitter region 41. An emitter electrode 42 is ohmically connected to a portion of the upper surface of the emitter region, and a portion of the silicon dioxide layer 16 covers the portions of the emitter-base junction 43 where it comes to the surface 15 of the device. The transistor includes an annular base electrode 44 which makes ohmic contact with the base region 13 and which has an extended peripheral region that is disposed over the junction 14 and the portion of the silicon dioxide layer 16 in the manner described above in connection with FIG. 3. A source 45 connected between ground and the collector electrode 19 through a load resistor 26 is poled reversely to bias the collector-base junction 14 of the transistor 40. The emitter of the transistor is grounded directly through a lead or connection 46. Input signals from terminals 31, 31 are applied between the base electrode 44 and ground through a resistor 47 and a connection 48. The transistor is normally maintained in a nonconductive condition by a negative biasing source −E connected through a resistor 49 to the base connection 48. It will be clear to those skilled in the art that for some applications it may be desirable that the region 13 be an epitaxial layer on a more highly doped N-type substrate. While this has not been represented in the drawing, it will be obvious to workers in the semiconductor art.

OPERATION OF TRANSISTOR OF FIG. 4

The general operation of the transistor and the circuit of FIG. 4 are similar to that of a conventional grounded-emitter NPN transistor inverter circuit and will be mentioned only briefly. The source −E maintains the transistor normally nonconductive. The application of a positive pulse to the terminals 31, 31 of sufficient magnitude to overcome that bias renders the transistor conductive and the flow of current established in the load resistor 26 develops a negative-polarity output pulse at the terminals 30, 30. Since the base electrode 44 is reversely biased with respect to the collector electrode 19 and since the base electrode 44 has a peripheral portion extending over the collector-base junction 14 and a portion of the collector region 12, the base electrode is effective to reduce the accumulation of negative charged carriers in the surface portion of the collector region in a manner similar to that explained in connection with FIGS. 1 and 3. As a result, the collector-base junction breakdown voltage is greatly increased to a value which is nearly that of the true avalanche breakdown of the transistor wafer. In some transistors, collector-base breakdown voltages as high as 400 volts have been realized.

In an NPN silicon transistor in accordance with the present invention having an N-type collector region with an impurity concentration of $10^{15}$ atoms per cubic centimeter, a P-type base region with an impurity concentration of $8\times10^{17}$ atoms per cubic centimeter, and N-type emitter region with a concentration of $1\times10^{21}$, a collector-base junction depth of 0.09 mil, an emitter-base junction depth of 0.045 mil, a base width of 0.045 mil, a silicon dioxide layer thickness of 6000–7000 angstroms and a 2 mil overlap of the collector-base junction by the silicon dioxide layer, there has been obtained a collector-base avalanche breakdown voltage of 100 volts. in the absence of the extended portion on the base contact, avalanche voltages of about 30 volts less were obtained.

An array of silicon planar NPN transistors have been made simultaneously on an $N^+$ substrate having an epitaxial layer of 0.9 ohm centimeter N-type material. The base contact geometry was alternated between the extended base contacts in accordance with the invention and the nonextended contacts of the prior art. The following chart indicates results which were realized for transistors 1–5 through the use of the extended base contact in contrast with results obtained for the prior-art transistors A–D.

| Transistor | Collector-base breakdown voltage, $BV_{cbo}$ at 10 micro-amperes | Collector-emitter breakdown voltage. $BV_{ceo}$ at 5 micro-amperes | Collector-base leakage curent in nanoseconds |
|---|---|---|---|
| 1 | 86 | 56 | 8 |
| 2 | 89 | 54 | 2 |
| 3 | 89 | 56 | 19 |
| 4 | 89 | 52 | 16 |
| 5 | 89 | 52 | 4 |
| A | 50 | 38 | 51 |
| B | 46 | 51 | 35 |
| C | 60 | 54 | Over 1,000 |
| D | 62 | 50 | 12 |
| E | 55 | 53 | 57 |

It will be seen that the improvement in the collector-base breakdown voltage and the collector-base leakage current is very significant.

DESCRIPTION AND OPERATION OF FIG. 5 DIODE

Figure 5:
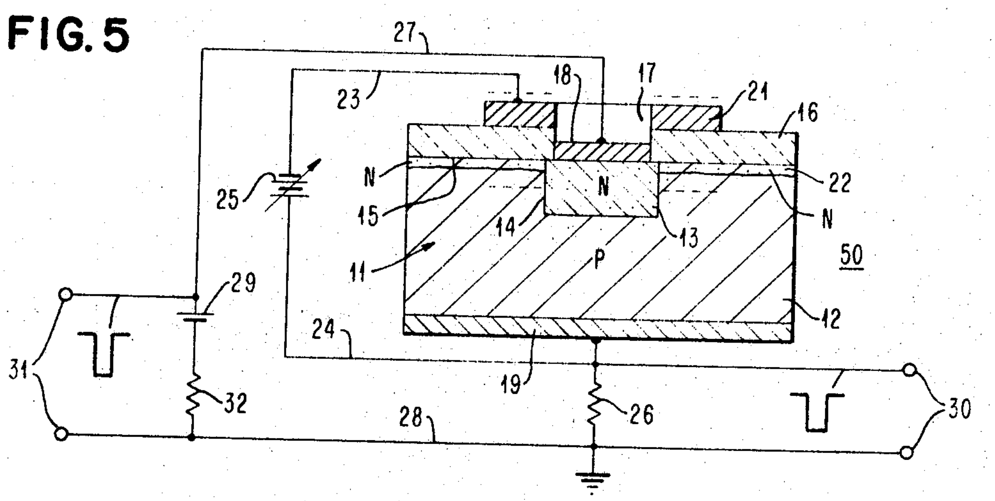
FIG. 5 is yet another circuit diagram of a signal-translating circuit which includes a semiconductor diode in another embodiment of the invention.

FIG. 5 represents a semiconductor diode 50 and the circuit therefor that are essentially the same as those of FIG. 1. Accordingly, corresponding elements in the two figures are designated by the same reference numerals. FIG. 5 differs from FIG. 1 in that the material of the starting wafer of region 12 is P-type rather than N-type semiconductor material and an N-type impurity is diffused into part of the upper portion of the wafer to form PN junction 14 and the region 13. The polarity of the biasing source 29 is poled reversely to bias the junction 14.

In the fabrication of a device of the type under consideration, an undesirable N-type skin or channel 22 is formed on the surface of the P-type region 12, particularly when the latter is rather lightly doped. This skin represents a leakage path between the N-type region 13 and the P-type region 12 across the surface of the latter to the uncovered and unpassivated vertical edge of the diode. The negative bias applied by the source 25 to the field-producing electrode 21 repels negative charge carriers in the skin 22 underlying that electrode and removes some or all those carriers depending upon the magnitude of the bias established by the source 25. By this technique the skin underlying the electrode 21 can effectively be eliminated and the surface of region 12 made P-type. Not only are surface leakage paths between the regions 12 and 13 eradicated, but also the reverse-voltage breakdown of the device is greatly improved.

Negative polarity pulses are effected to overcome the threshold bias afforded by the source 29 and render the diode conductive for developing negative-going output pulses at the terminals 30, 30.

DESCRIPTION AND OPERATION OF TRANSISTOR OF FIG. 6

Figure 6:
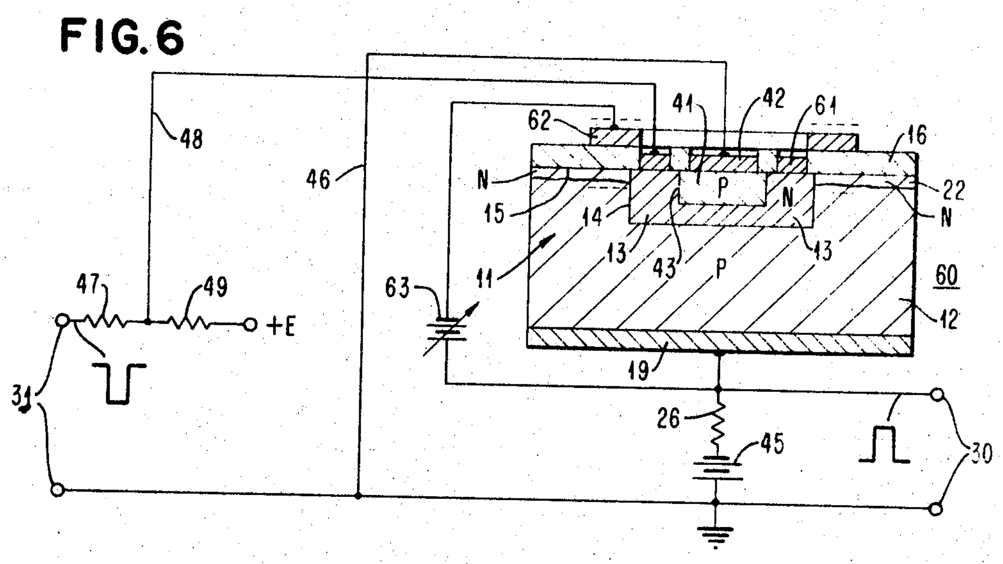
FIG. 6 is an additional circuit diagram of a signal-translating circuit which includes a transistor in accordance with a modified form of the invention.

Referring now to FIG. 6 of the drawings, there is represented a planar PNP transistor 60 which in many ways is generally similar to the NPN transistor 40 of FIG. 4. For this reason corresponding elements in the two figures are identified by the same reference numerals. Since the base electrode 61 of the PNP transistor under consideration requires a forward bias that is supplied by the source +E through connection 48, it is necessary to employ a discrete field electrode 62 which is biased negatively with respect to the electrode 49 by the source 63.

In the fabrication of the PNP transistor 60, an N-type skin 22 develops at the surface 15 of the P-type collector region 12 under the silicon dioxide layer 16. This skin constitutes an undesirable leakage path between the collector and base regions 12 and 13, respectively, of the device, impairs the efficiency of the latter, and undesirably increases collector capacitance. Prior to the present invention the reduction of this collector capacitance has been a particularly difficult problem in planar PNP transistors. Furthermore, when two or more PNP transistors are constructed on a single substrate as is required today for many applications, the N-type skin 22 extends between the two base regions and undesirably interconnects them so that their isolation is lost.

The reversely-biased electrode 62 eliminates this interconnection in the manner explained above in connection with the diode 50 of FIG. 5 by effectively eliminating or interrupting the N-type skin 22 where it underlies that electrode. The collector-base avalanche breakdown voltage of the transistor is greatly increased, the collector-base leakage current is significantly reduced, and the current gain of the device is improved. By adjusting the magnitude of the bias voltage supplied by the source 63, the collector capacitance of the transistor can be quite readily controlled.

The transistor 60 is connected as a grounded-emitter inverter in which negative-polarity input pulses to the terminals 31, 31 overcome the threshold bias and render the device conductive so as to develop positive-polarity output pulses at the output terminals 30, 30.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A signal-translating circuit comprising:

a silicon semiconductor device having first and second regions of opposite conductivity types, said second region being inset into said first region and defining a PN junction extending inwardly from a surface of said device, ohmic connections to said first and second regions, a layer of insulating material adherent to said surface, an area-type electrode on said layer and overlying said junction and at least part of said first region adjacent said junction;

biasing means including a load impedance connected between said ohmic connections, said biasing means providing said junction with a reverse-bias voltage greater than the pseudo breakdown voltage of the junction;

biasing means for poling said electrode negatively with respect to the ohmic connection to said first region to control the accumulation of negative charge carriers in a surface portion of said first region underlying said electrode for increasing the reverse-voltage breakdown characteristic of said junction; and control means coupled to said second-mentioned biasing means to reduce the negative biasing for rendering said device conductive to establish a flow of energy through said load impedance.

2. The circuit of claim 1 wherein said second region is the P region.

3. The circuit of claim 1 wherein said second region is the N region.

References Cited

UNITED STATES PATENTS

| | | | |
|---|---|---|---|
| 3,097,308 | 4/1964 | Wallmark | 317—235 |
| 3,204,160 | 8/1965 | Sah. | |
| 3,237,721 | 3/1966 | Arnold et al. | |
| 3,206,670 | 9/1965 | Atalla | 317—235 |

FOREIGN PATENTS

| | | |
|---|---|---|
| 1,339,897 | 9/1963 | France. |
| 1,361,215 | 7/1963 | France. |

OTHER REFERENCES

Journal of Applied Physics, "Effect of Variations in Surface Potential on Junction Characteristics," June 1959, vol. 30, No. 6, pp. 906–912.

JOHN W. HUCKERT, *Primary Examiner.*

JERRY D. CRAIG, *Assistant Examiner.*

U.S. Cl. X.R.

317—235